(12) United States Patent
Wakuda et al.

(10) Patent No.: US 7,307,210 B2
(45) Date of Patent: Dec. 11, 2007

(54) SOLAR CELL AND METHOD OF PRODUCING THE SAME

(75) Inventors: Junzou Wakuda, Kashihara (JP); Masaomi Hioki, Gose (JP); Satoshi Tanaka, Yamatotakada (JP); Tomohiro Machida, Yao (JP); Kunio Kamimura, Kashiba (JP); Tatsuo Saga, Shiki-gun (JP); Takashi Tomita, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 155 days.

(21) Appl. No.: 10/167,649

(22) Filed: Jun. 13, 2002

(65) Prior Publication Data

US 2003/0000571 A1    Jan. 2, 2003

(30) Foreign Application Priority Data

Jun. 13, 2001 (JP) ............................. 2001-177995
Aug. 2, 2001 (JP) ............................. 2001-234817

(51) Int. Cl.
*H01L 31/0203* (2006.01)

(52) U.S. Cl. ................. 136/256; 136/244; 136/251; 136/259; 257/433; 257/464; 257/466

(58) Field of Classification Search ............... 136/256, 136/251, 244; 257/433, 464, 466
See application file for complete search history.

(56) References Cited

U.S. PATENT DOCUMENTS

| | | | | |
|---|---|---|---|---|
| 4,132,570 A | * | 1/1979 | Caruso et al. | 136/244 |
| 4,287,382 A | * | 9/1981 | French | 136/244 |
| 4,728,370 A | * | 3/1988 | Ishii et al. | 136/258 |
| 5,100,808 A | * | 3/1992 | Glenn | 438/68 |
| 5,118,362 A | * | 6/1992 | St. Angelo et al. | 136/256 |
| 5,273,911 A | * | 12/1993 | Sasaki et al. | 438/62 |
| 5,320,684 A | * | 6/1994 | Amick et al. | 136/256 |
| 6,132,585 A | * | 10/2000 | Midorikawa et al. | 205/123 |
| 6,288,323 B1 | | 9/2001 | Hayashi et al. | |
| 6,355,875 B1 | * | 3/2002 | Kamimura | 136/256 |
| 6,566,595 B2 | | 5/2003 | Suzuki | |
| 6,679,759 B2 | * | 1/2004 | Kajimoto et al. | 451/41 |
| 6,710,239 B2 | * | 3/2004 | Tanaka | 136/256 |
| 6,787,692 B2 | | 9/2004 | Wada et al. | |
| 2001/0029977 A1 | | 10/2001 | Oya | |
| 2004/0003836 A1 | * | 1/2004 | Watsuji et al. | 136/243 |

(Continued)

FOREIGN PATENT DOCUMENTS

JP    8-186281    7/1976

(Continued)

OTHER PUBLICATIONS

Tanaka, U.S. Appl. No. 10/038,681, filed Jan. 8, 2002.

(Continued)

*Primary Examiner*—Edna Wong
*Assistant Examiner*—Anthony Fick
(74) *Attorney, Agent, or Firm*—Nixon & Vanderhye P.C.

(57) ABSTRACT

In a solar cell, at least one of reinforcing material and buffering material is provided at least partially on at least one of a back surface, a front surface and a side surface of the solar cell. With these reinforcing material and/or buffering material, occurrence of cell fracture due to load imposed by external force can be decreased.

10 Claims, 19 Drawing Sheets

U.S. PATENT DOCUMENTS

| | | |
|---|---|---|
| 2004/0112423 A1 | 6/2004 | Suzuki et al. |
| 2004/0149332 A1* | 8/2004 | Tanaka et al. .............. 136/256 |
| 2004/0154658 A1* | 8/2004 | Tanaka et al. .............. 136/256 |

FOREIGN PATENT DOCUMENTS

| | | | |
|---|---|---|---|
| JP | 61-108178 | * | 5/1986 |
| JP | 61-268428 | | 11/1986 |
| JP | 63-051152 | | 4/1988 |
| JP | 05-110122 | | 4/1993 |
| JP | 09-051118 | | 2/1997 |
| JP | 10-247629 | | 9/1998 |
| JP | 11-50607 A | * | 2/1999 |
| JP | 2000-349310 | | 12/2000 |
| JP | 2003-069055 | | 7/2003 |

OTHER PUBLICATIONS

Kajimoto, U.S. Appl. No. 09/956,113, filed Sep. 20, 2001.
U.S. Appl. No. 10/668,376 filed Sep. 24, 2003.
Office Action mailed Mar. 6, 2007 in U.S. Appl. No. 10/668, 376.
U.S. Appl. No. 10/668,376, filed Jun. 17, 2004, Suzuki et al.

* cited by examiner

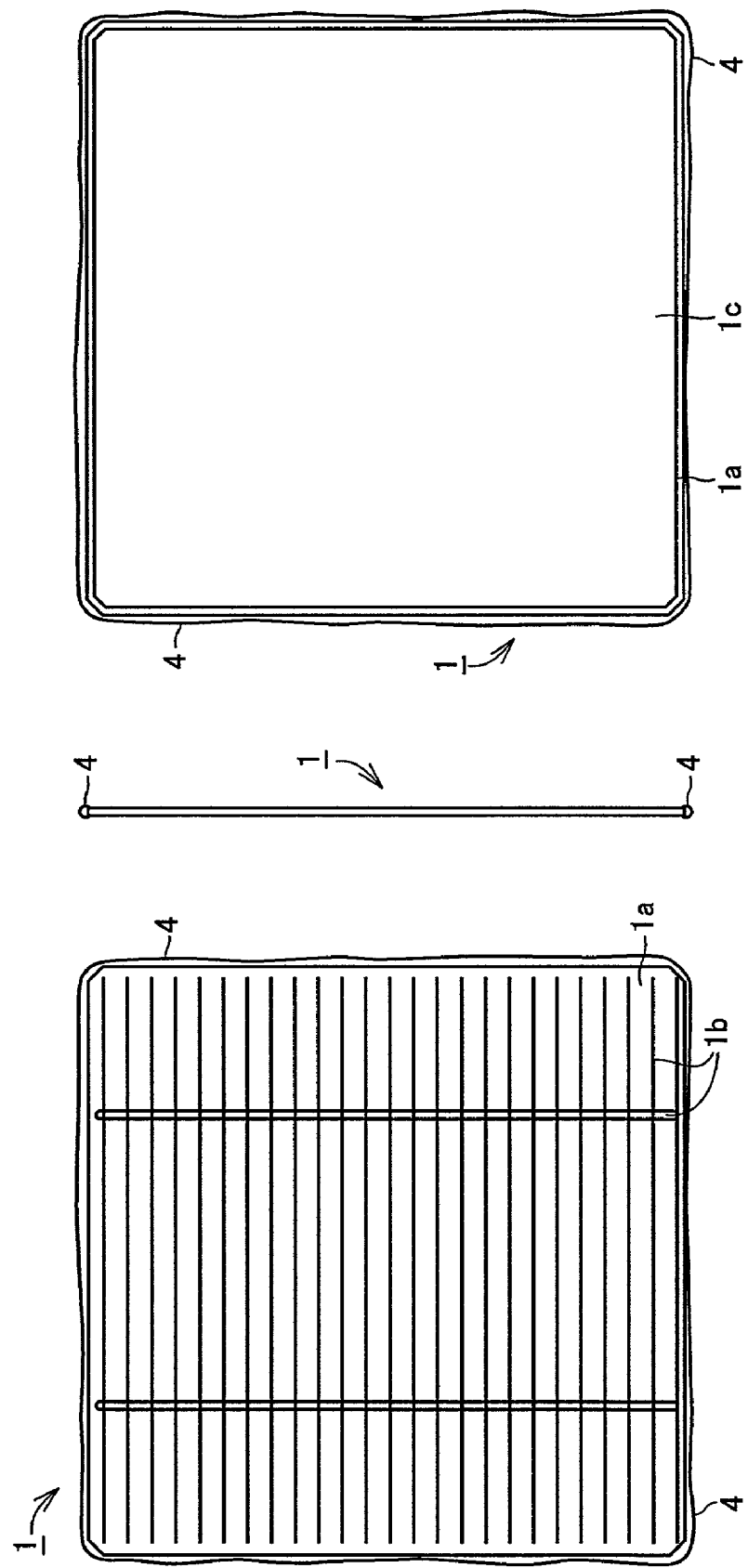

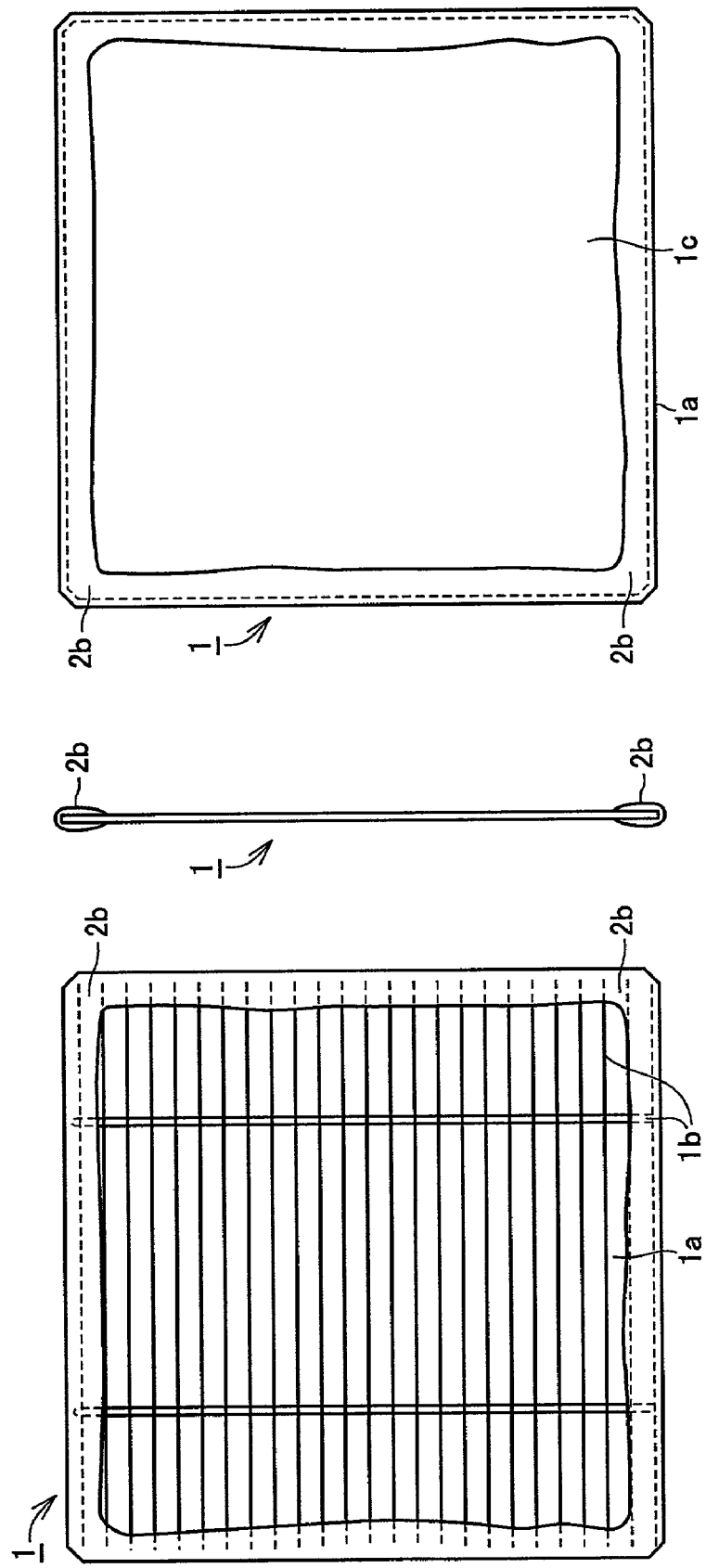

FIG.12
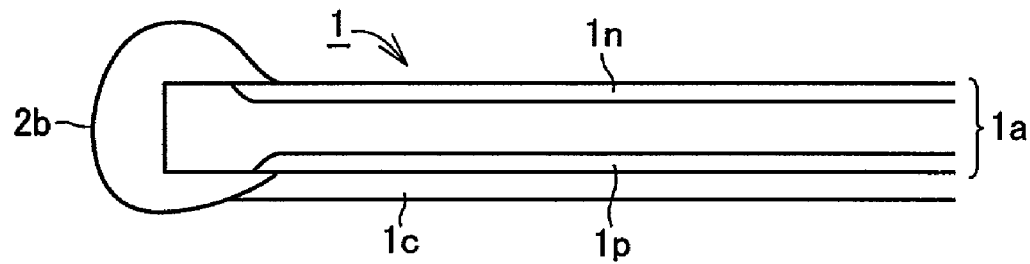
FIG.13A  FIG.13B
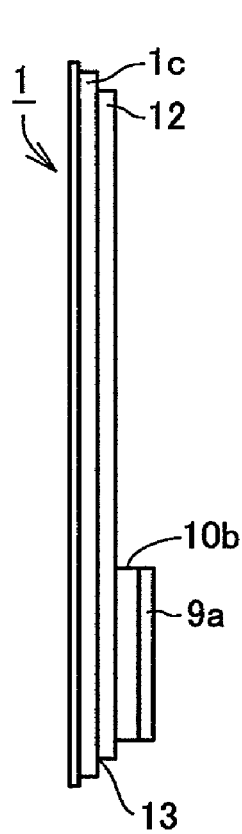 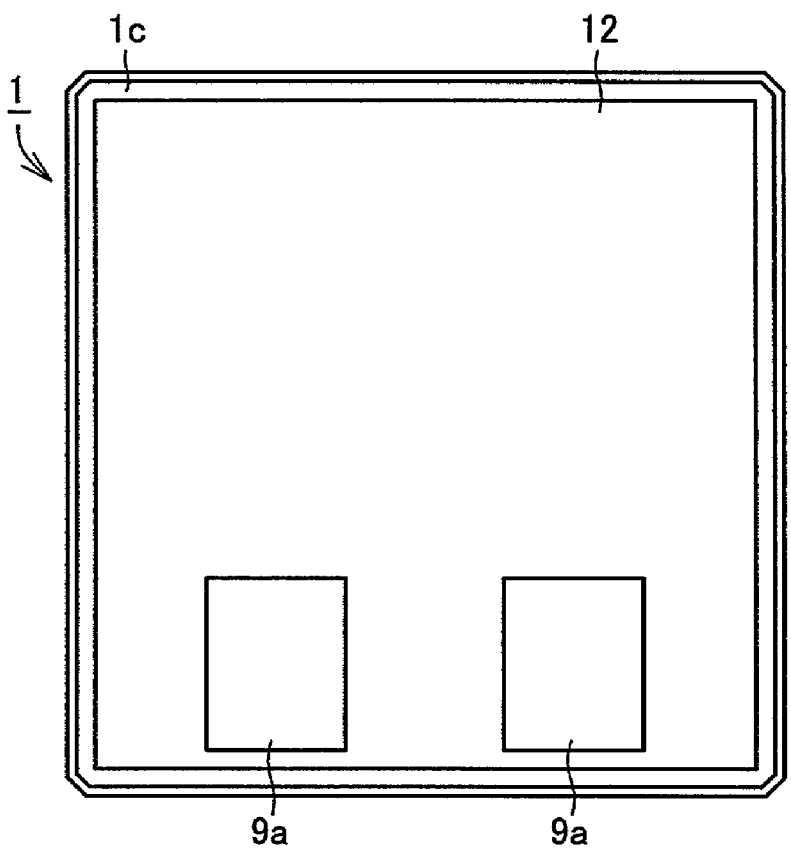

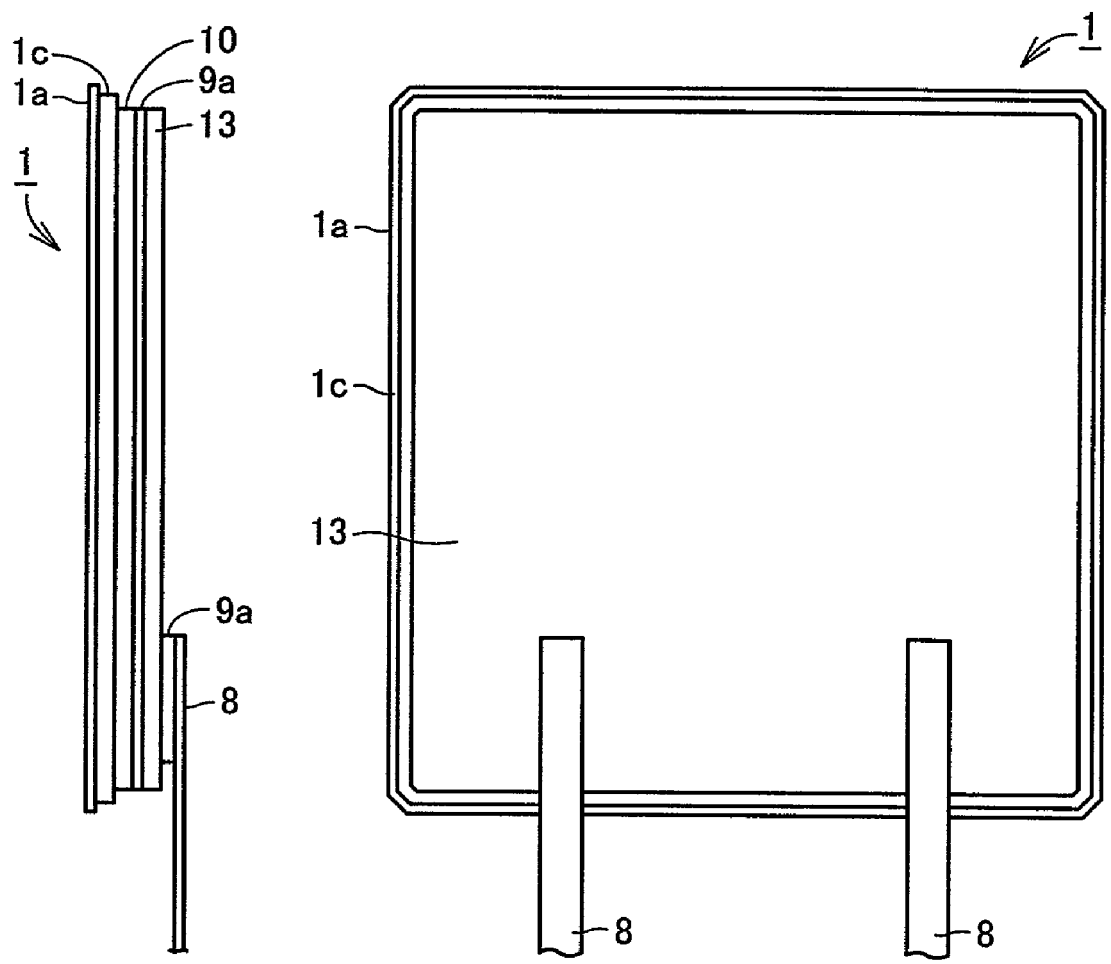

SOLAR CELL AND METHOD OF PRODUCING THE SAME

BACKGROUND OF THE INVENTION

1. Field of the Invention

The present invention relates to a solar cell formed on a semiconductor substrate and a method of producing the same, and particularly to improvements in a solar cell formed on a thin semiconductor substrate liable to fracture and in a method of producing the same.

2. Description of the Background Art

A semiconductor silicon substrate for a solar cell is cut out from a monocrystalline or polycrystalline semiconductor ingot to a thickness of about 300 to 350 μm, using an inner-edge slicer, an outer-edge slicer, a wire saw, or the like. In producing the solar cell, a pn junction for causing photoelectric conversion is formed in the silicon substrate, and then an anti-reflection coating for increasing light entrance into the substrate, an electrode for efficiently extracting photoelectric conversion current, and the like are formed.

In FIGS. 25A to 25C, an example of a conventional solar cell is shown. FIG. 25A shows a front surface provided as a light-receiving face of the cell, FIG. 25B shows a back surface of the same, and FIG. 25C shows a cross-section taken along a line 25X-25X in FIG. 25A. When producing such a conventional solar cell 1, any damaged layer caused by slicing off a silicon wafer 1a is initially removed from the wafer by alkaline etching. An n-type impurity is then applied on a surface of silicon substrate 1a, and a pn junction is formed near the light-receiving face side by thermal diffusion. On the light-receiving face side of substrate 1a, an anti-reflection coating (not shown) is formed with plasma CVD (chemical vapor deposition), and on the back surface, a backside collector electrode 1c is formed by printing and baking aluminum paste with a screen process. Further, by printing and baking silver paste with the screen process, a comb-like collector electrode 1b is formed on the light-receiving face side of substrate 1a, and a connection electrode 1d is formed on the back surface. The surfaces of electrodes 1b, 1d composed of baked silver are coated with solder layers 1e by dip soldering.

Further, interconnectors made of conductive metal bands are connected between solar cells, to fabricate a solar battery module including several tens of solar cells. In the solar battery module, a glass plate is joined with transparent resin to the front side of the several tens of solar cells arranged in an array, and then an insulating film, a moisture-proof film and the like are provided on the backside. Terminals for externally extracting electric current are drawn from both ends of a solar cell circuit.

In order to reduce cost for such a solar battery module, it is necessary to make thinner semiconductor silicon substrates which account for a large part of the cost, so as to reduce usage of expensive silicon material. If silicon substrates are made thinner, however, fracture of solar cells will increase in production process of the solar cells and modules, resulting in lower production yield. That is, this will not necessarily lead to cost reduction. In addition, if the solar cells are made thinner, the fracture of the same will be liable to occur, for example, due to temperature cycles experienced during use of the completed solar battery modules, and hence the quality and reliability of the modules may be lowered. Therefore, the silicon substrates in the conventional mass-produced solar cells generally have a thickness of about 300 to 350 μm.

In other words, if silicon wafers cut out from a silicon ingot are made thinner, invisibly small cracks, flaws or chips will be liable to occur in edge portions of the wafers in production processes of the silicon substrates, the solar cells and the solar battery modules. Originating from those defects, larger cracks or fractures are likely to be developed. Fractures in the silicon substrates during the manufacturing process of the modules cause loss of substrate material, replacement of the cracked substrates and need for additional work for removing cracked pieces from manufacturing apparatus. As a result, the cost of the solar cells and the modules will be increased. In particular, if a solar cell substrate (a wafer) fractures during production of the solar battery module, the entire module will be defective and resulting in larger loss. Even if the solar battery module is flawless immediately after its completion, fractures may likely be caused later in the cells, for example, by temperature cycles during use of the module in the case that the solar cell substrates are thin.

SUMMARY OF THE INVENTION

In view of the above-described problems in the prior art, an object of the present invention is to provide solar cells and a method of producing the same, which can reduce manufacturing cost without lowering reliability of the cells, by decreasing cell fracture in manufacturing process of the solar cells and modules, even if semiconductor substrates used therefor are made thinner. In solar battery modules which are final products manufactured with the solar cells provided according to the present invention, manufacturing cost will be lowered without deteriorating quality and reliability of the modules.

In a solar cell according to the present invention, at least any one of a reinforcing material and a buffering material is provided at least partially on at least any one of a back surface, a front surface and a side surface of the cell.

Such a reinforcing material or a buffering material is desirably provided in the solar cell formed with a semiconductor substrate, which particularly has a generally rectangular main surface with each side of more than 10 cm and has a thickness of less than 350 μm.

The reinforcing material or the buffering material may include at least any one of glass, epoxy resin, acrylic resin, EVA (ethylene-vinyl acetate) resin, silicone resin, baked silver, glass fiber, carbon fiber, metal plate, ceramic plate and resin plate.

The reinforcing material may be cured after injection into at least any one of cracks, flaws and chips contained in the solar cell.

On the back surface of the solar cell, a conductive reinforcing material can be provided, to which interconnectors for adjacent cells may be connected. On the front surface side of the solar cell, a transparent reinforcing material may be provided.

In an assembly process of the solar battery module, the reinforcing material or the buffering material may be provided to a portion that contacts a jig for positioning or handling the solar cell to be included in the module.

The reinforcing material may be patterned in order to reduce stress caused by difference in thermal expansion coefficients between the reinforcing material and the semiconductor substrate when the temperature changes in an environment where the solar cell is used.

A material that does not alter in quality even at a solder temperature in a dip soldering step of the solar cell may be preferably used as the reinforcing material.

A glass material may also be used as the reinforcing material, which is prepared by applying a solution having powdered glass dissolved in a solvent, volatilizing the solvent, and then baking the residue. In a producing method of the solar cell including the reinforcing material made of glass material, steps of baking the glass material for the reinforcing material and baking a backside aluminum electrode of the cell may simultaneously be carried out.

A transparent reinforcing material having a thermal expansion coefficient comparable to that of the reinforcing material provided on the back surface of the solar cell may be provided on the front surface thereof.

A plate included in the reinforcing material may be joined to the solar cell by soldering or welding. The reinforcing material, such as an aluminum plate or a mesh aluminum plate, may be joined to the back surface side of the solar cell by a baking step of print aluminum paste.

It is particularly preferable that a reinforcing material provided to at least a peripheral portion on the back surface of the solar cell is formed with baked silver. It is preferable that collector electrodes on the front surface and connection electrodes on the back surface of the solar cell are formed also with baked silver.

In general, on the back surface of the solar cell, a baked aluminum collector electrode is formed except for a peripheral edge portion, and the reinforcing material of baked silver is formed preferably on the peripheral edge portion of the baked aluminum collector electrode. Further preferably, the reinforcing material of baked silver is formed, extending also over the peripheral edge portion on the back surface of the cell substrate made of silicon.

The baked silver reinforcing material is not necessarily provided along the entire periphery of the solar cell, and it may be formed along vicinities of only two sides intersecting a direction in which the cell is connected to the other cells by the interconnectors.

The baked silver reinforcing material preferably has a width of less than 4 mm. In addition, the baked silver reinforcing material is preferably formed at least 0.5 mm away from the peripheral edge of the solar cell.

Preferably, the interconnector is connected to both of the baked silver reinforcing material and the connection electrode on the back surface of the cell. The baked silver reinforcing material is preferably expanded in width in a region where the interconnector is connected.

Preferably, the baked silver reinforcing material is provided with at least one discontinuity so as not to be continuous along the entire periphery on the back surface of the solar cell. In this case, discontinuities for the baked silver reinforcing material are preferably provided at both end portions of one side of the solar cell. Preferably, the discontinuity for the baked silver reinforcing material is formed diagonally, relative to one side of the cell. It is also preferable that the baked silver reinforcing material includes a comb-tooth pattern.

In producing the solar cell, it is preferable that the baked silver reinforcing material and the baked silver connection electrode on the back surface of the cell are formed simultaneously. Moreover, in producing the solar cell, when dip soldering is carried out for coating the collector electrode on the front surface of the substantially rectangular cell, the connection electrode on the back surface and the baked silver reinforcing material with a solder layer, the rectangular cell is preferably pulled up approximately along a diagonal thereof from a solder bath.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 19B show solar cells according to other embodiments of the present invention.

DESCRIPTION OF THE PREFERRED EMBODIMENTS

Figure 1:
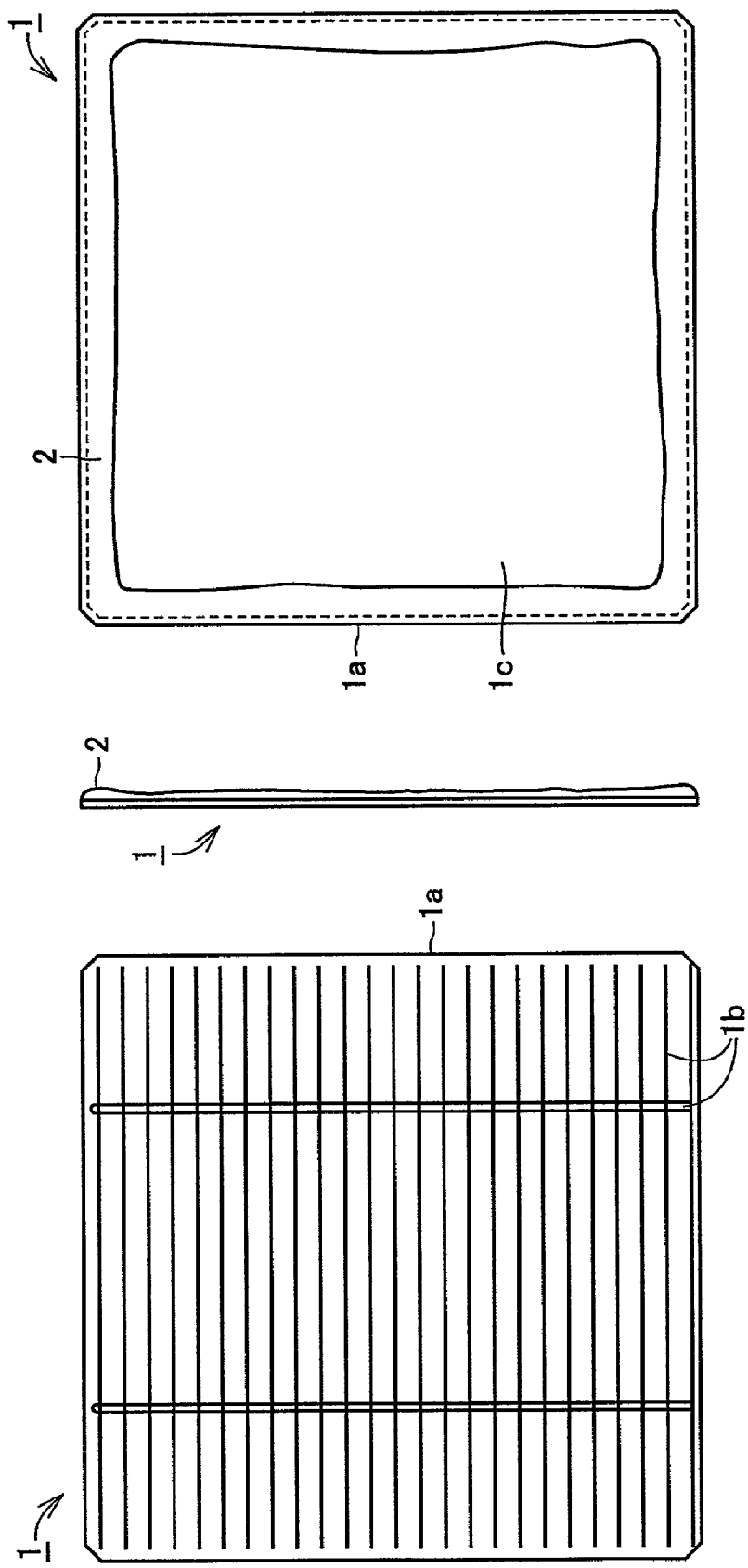
FIGS. 1A to 1C show a solar cell according to one embodiment of the present invention.

A possible mechanism that causes fracture in a silicon wafer or a solar cell is thought as follows. Small cracks, flaws or chips are produced in silicon wafer edge portions during manufacturing processes of silicon wafers, solar cells and solar battery modules. In various process steps of the wafer or the cell in the production process of the module, those defective portions are subject to excessive stress and will develop to fractures. In particular, the cell edge portion is subject to large stress (antiplane shear stress, in particular) in assembling of the solar battery module, because of soldering of interconnectors made of metal having a considerably different thermal expansion coefficient from that of the solar cell. Here, if the cell contains a minute crack or the like, stress will be concentrated at such a local portion to develop the crack, finally causing cell fracture.

In this case, stress concentration at such local portions can be reduced by reinforcing the cell edge with a reinforcing material. Accordingly, the reinforcing material is required to have a property to set the minute crack in the cell edge so that the antiplane shear stress imposed thereto can be alleviated. Therefore, a strong material having a large adhesive strength and a large modulus of longitudinal elasticity is desirable. Moreover, it is desirable that such a reinforcing material can be applied on the solar cell without increasing the production steps of the cell, in view of cost. Examples of specific reinforcing methods are as follows.

1. The back surface side not contributing to photoelectric conversion of the solar cell wafer is reinforced by resin. The reinforcing material bears any load imposed in handling the wafer. Thus, fracture of the solar cell wafer is prevented.

2. A buffering material is provided on the side surface portion of the solar cell wafer so that the load is not directly imposed thereto in handling during the production process. Thus, the solar cell wafer is prevented from fracture.

3. A resin having a high adhesive strength is injected into gaps of flaws or cracks present in peripheral portions of the solar cell wafer. Thus, flaws and cracks are prevented from developing to fractures.

In the following, embodiments of the present invention will be described in detail with reference to the drawings. It is noted that the same reference characters refer to the same or corresponding components in the figures. For the sake of simplicity and clarity of the drawings, relation between dimensions such as length and thickness in each drawing of the present application is modified as appropriate, and does not represent actual dimensional relation.

In FIGS. 1A to 1C, a solar cell according to one embodiment of the present invention is schematically shown. FIG. 1A shows a front surface, FIG. 1B shows a side surface, and FIG. 1C shows a back surface, of a solar cell 1. Solar cell 1 includes a silicon substrate 1a. Formed on the front surface of substrate 1a is a conventional comb-shaped silver electrode 1b for collecting current. The back surface of solar cell 1 is covered with a backside aluminum electrode 1c. A peripheral portion on the back surface of solar cell 1 is reinforced with resin 2.

Solar cells usually have a thickness of about 350 μm. However, thinner solar cells have been desired in order to increase the number of cell substrates obtainable from an ingot for reducing cost. Cell fracture during production process has not been a serious problem for cell substrates having the thickness of about 350 μm. However, when solar cells are made thinner in order to increase the number of wafers obtainable from an ingot, ratio of the fracture occurrence increases dramatically. As such, it is expected that the present invention is more effective particularly in thinner solar cells.

The size of the solar cell's main surface is usually about 10 cm square or larger. Cost reduction for the solar cell can be achieved also by making larger the dimension of the main surface thereof. In contrast, as the solar cell is made thinner and as the area of the main surface thereof is made larger, the solar cell is more likely to fracture.

In FIGS. 1A to 1C, solar cell 1 is reinforced with resin 2 on the back surface thereof. This will have an effect of increasing cell strength against thermal stress or external mechanical force imposed thereto during the production process of the solar battery module. As the back surface side of the solar cell does not require transparency, resin 2 can be opaque and then an appropriate kind of reinforcing resin can be selected in view of its workability and cost. When external force is imposed to solar cell 1, the harder the reinforcing material 2 is, the larger load will be born by the reinforcing material. Therefore, hard material (having high elastic modulus) is desired for reinforcing material 2. Further, the reinforcing material of harder property tends to easily achieve the effect of reinforcing even when it is made thin. Here, it goes without saying that, reinforcing material 2 may be provided to a wider area on the back surface of solar cell 1 than shown in FIG. 1, or to the entire back surface.

Figure 2:
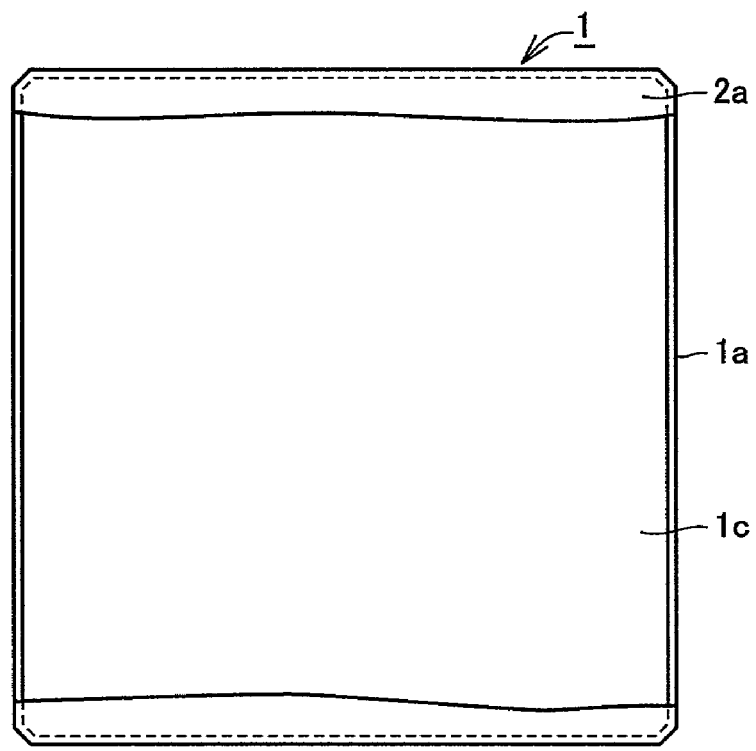

In FIG. 2, a back surface of a solar cell 1 according to another embodiment of the present invention is shown, in which a resin-reinforcing portion 2a is limited to vicinities of two sides opposing to each other on the back surface of the cell. Usually, opposing two sides of the cell are subject to external force in the production processes of the solar cell and the solar battery module. Instead of reinforcing the vicinity of the entire peripheral edge on the back surface of the cell as in FIGS. 1A to 1C, therefore, by reinforcing the vicinities of only two sides readily subject to external force, a similar effect can be obtained. In addition, in positioning or handling the solar cell in the production process of the solar battery module, the reinforcing material provided to portions where the cell is in contact with a jig is expected to be effective as well.

In the examples of FIGS. 1A to 1C and FIG. 2, in order to increase the strength of reinforcing resin material 2, 2a to obtain higher elastic modulus, glass fiber, carbon fiber or the like may be mixed in the resin. Selection of a material with higher elastic modulus for a reinforcing material is expected to contribute to higher effect of preventing cell fracture. When it is difficult to obtain high elasticity only with resin, addition of reinforcing fibers is particularly expected to enhance the effect. Moreover, improvement in thermal resistance can also be expected, depending on a type of reinforcing fiber material to be added.

As glass fiber and carbon fiber has higher elastic moduli than silicon, those reinforcing fibers can bear larger stress when external force is imposed to the solar cell. Therefore, the load is less likely to be imposed to the cell, and reinforcement for the cell will be effectively improved. If a fiber material with high thermal resistance is mixed in the reinforcing material, the effect of reinforcing the cell will be maintained or improved even in an environment of high temperature in the production processes of the solar cell and the module.

Figure 3:
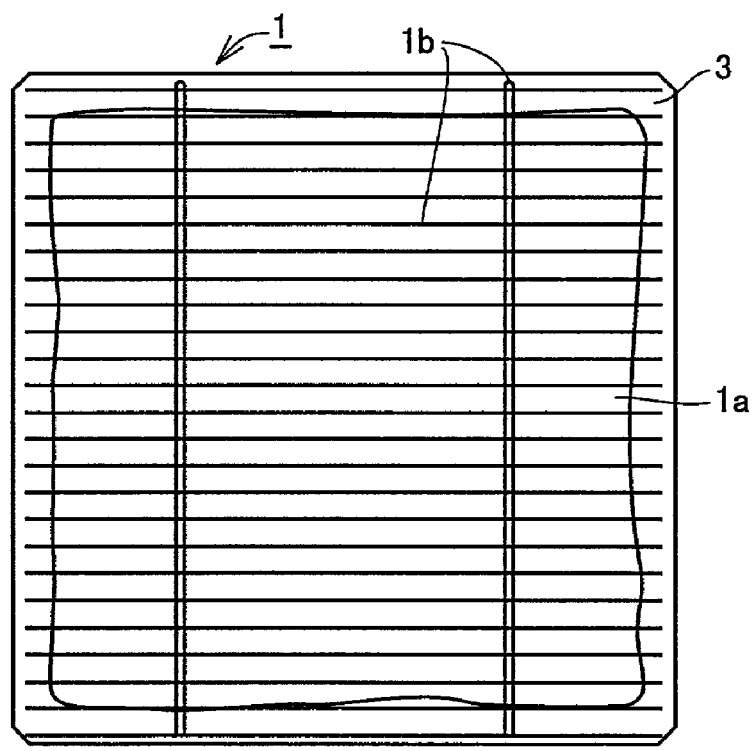

In an embodiment shown in FIG. 3, a transparent reinforcing material 3 is provided in a vicinity of a peripheral edge on a front side of a solar cell 1. The reinforcing material such as transparent resin or glass can reinforce the front surface side, not limited to the back surface side of solar cell 1. It goes without saying that reinforcement on the back surface side of the cell as shown in FIGS. 1A to 1C or FIG. 2 can be combined with that on the front surface side as shown in FIG. 3.

FIGS. 4A to 4C show a further embodiment. FIG. 4A shows a front surface, FIG. 4B shows a side surface, and FIG. 4C shows a back surface, of a solar cell. In this embodiment, a buffering material 4 is provided on the side surface side portion of a solar cell 1. When buffering material 4 is provided on the side surface portion of solar cell 1, damage to silicon substrate 1a due to concentration of external force to one point of the cell can be prevented in positioning or carrying the cell in the production process of the solar battery module. That is, use of a flexible material for buffering material 4 will serve to distribute the external force even if it is imposed on one point of solar cell 1. Thus, fracture of solar cell 1 will be less likely.

Figure 5A:
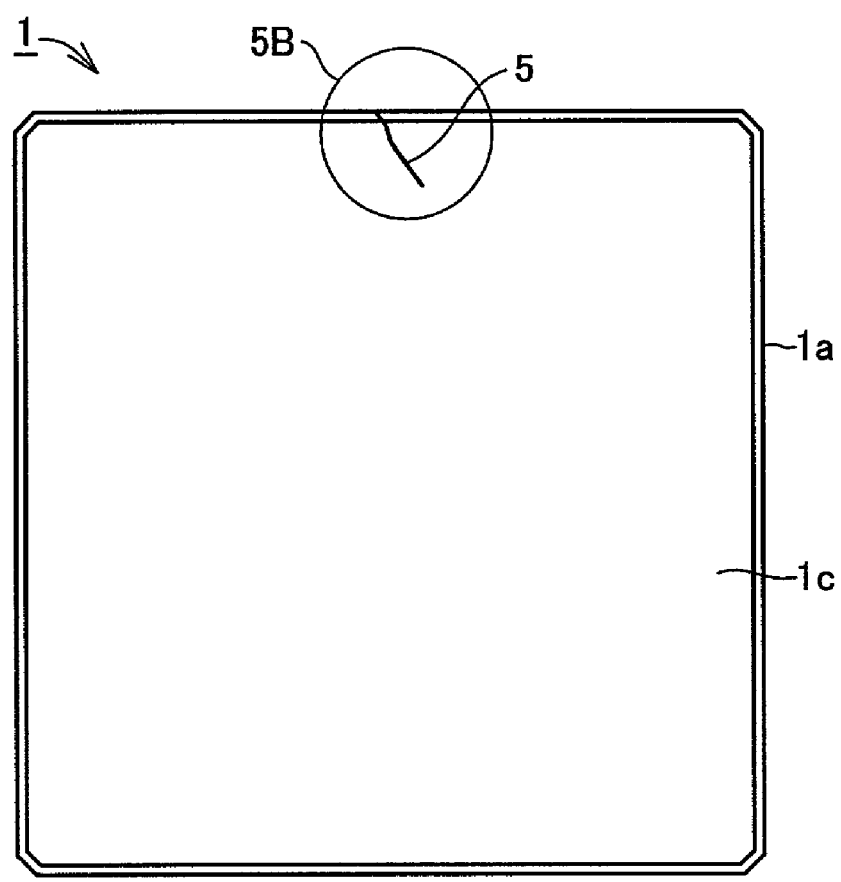
Figure 5B:
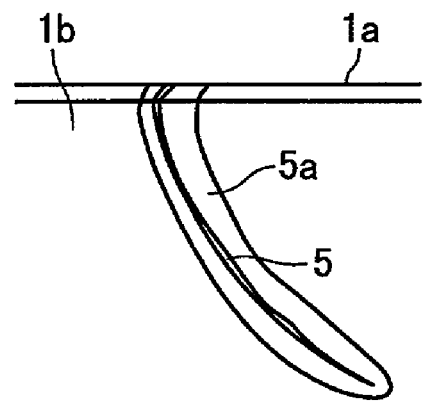

FIGS. 5A and 5B show a still further embodiment. FIG. 5A shows a back surface of a solar cell, and FIG. 5B shows an enlarged view of an encircled region 5B in FIG. 5A. In this embodiment, a liquid reinforcing material 5a is introduced and then cure in a flaw or cracked portion 5 in a peripheral edge of solar cell 1, and thus the flaw or crack 5 is joined and reinforced. When reinforcing material 5a is introduced in flaw or crack 5 for joint, the effect of reinforcement thereof is achieved by its adhesive strength, not by an influence of strength of reinforcing material 5a itself. Therefore, reinforcement is effective even if thickness of reinforcing material 5a is small, and thus the thickness itself is not significant.

In addition, as reinforcing material 5a in this example does not need to be thick, occurrence of thermal stress is almost negligible, which is due to a mismatch of thermal expansion coefficient of reinforcing material 5a itself relative to silicon or other materials constituting the solar battery module. Even if flaw or crack 5 is too small to be visually recognized, not the entire solar cell but such a weak portion can be selectively reinforced. This is achieved by utilizing the property of the liquid reinforcing material with wettability and surface tension to easily reach a small gap. For reinforcement in this application, therefore, reinforcing material 5a having properties of small viscosity, good fluidity, easy permeation to a small gap before curing and high adhesive strength can achieve the significant effect.

FIGS. 6A to 6C show a still further embodiment. FIG. 6A shows a front surface, FIG. 6B shows a side surface, and FIG. 6C shows a back surface, of a solar cell. In this embodiment, reinforcing material 2b is provided in vicinities of peripheral edge portions on both front and back sides of a solar cell 1. Therefore, warp of the cell will not be large even in an environment at a high or low temperature. That is, in the embodiment of FIGS. 6A to 6C, warp of the cell due to the difference of thermal expansion coefficients between the solar cell and the reinforcing material can be made smaller than in the case of providing the reinforcing material on only either one of the front and back surfaces of the solar cell.

Figure 7:
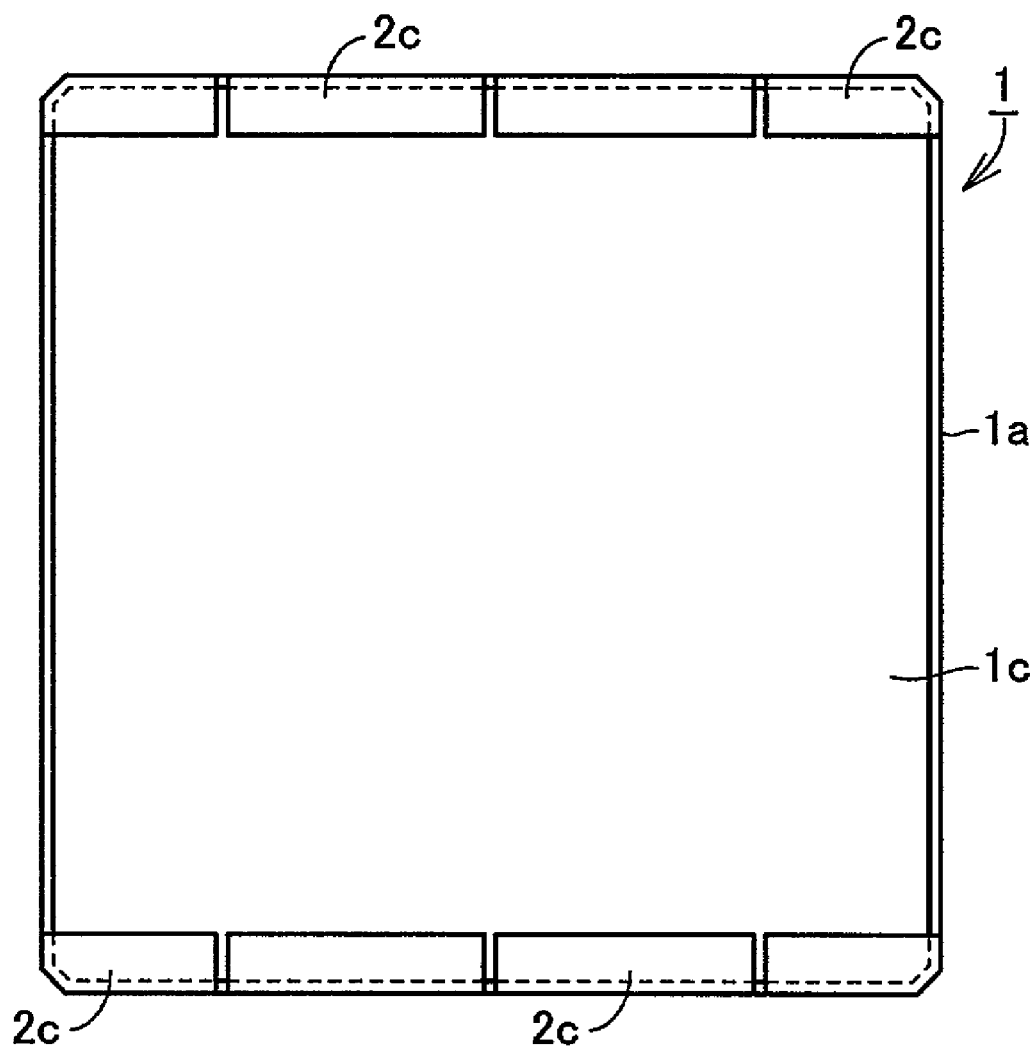

In an embodiment shown in FIG. 7, similarly as in FIG. 2, a reinforcing material 2c is provided in vicinities of opposing two sides on a back surface of a solar cell 1. In this embodiment, however, reinforcing material region 2c on the back surface of the cell is patterned so that thermal stress due to the difference of thermal expansion property between solar cell 1 and reinforcing material 2c can be made smaller. In other words, since the thermal stress due to the difference of thermal expansion property between cell 1 and reinforcing material 2c becomes larger as the reinforcing material region is longer, reinforcing material region 2c can be patterned so as to reduce the thermal stress without lowering the effect of reinforcing.

Figure 8A:
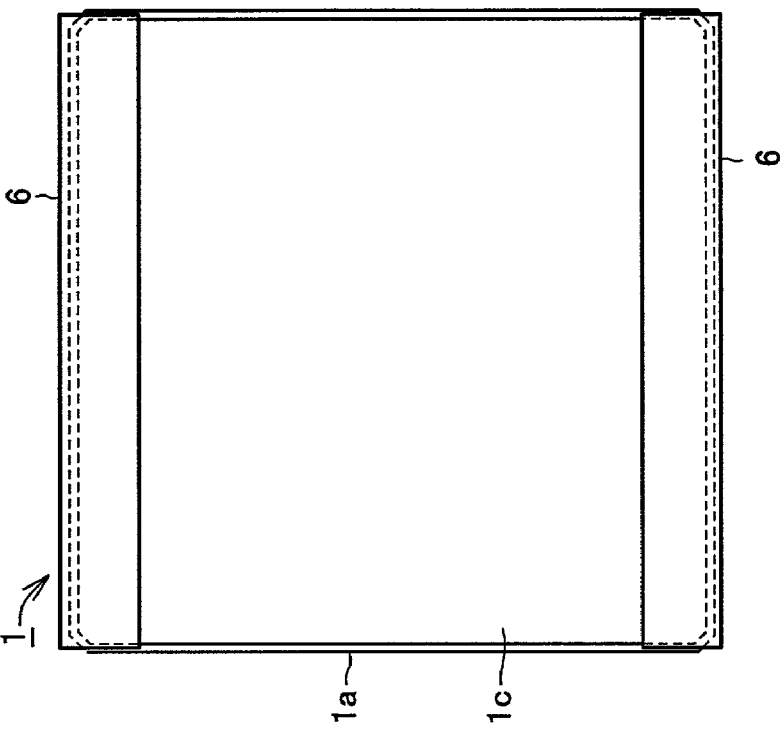
Figure 8B:
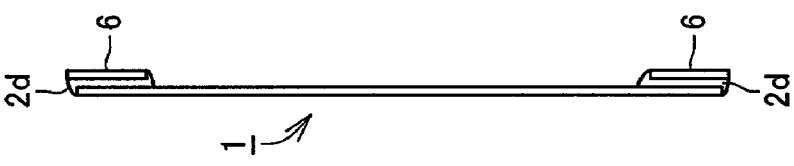
Figure 8C:
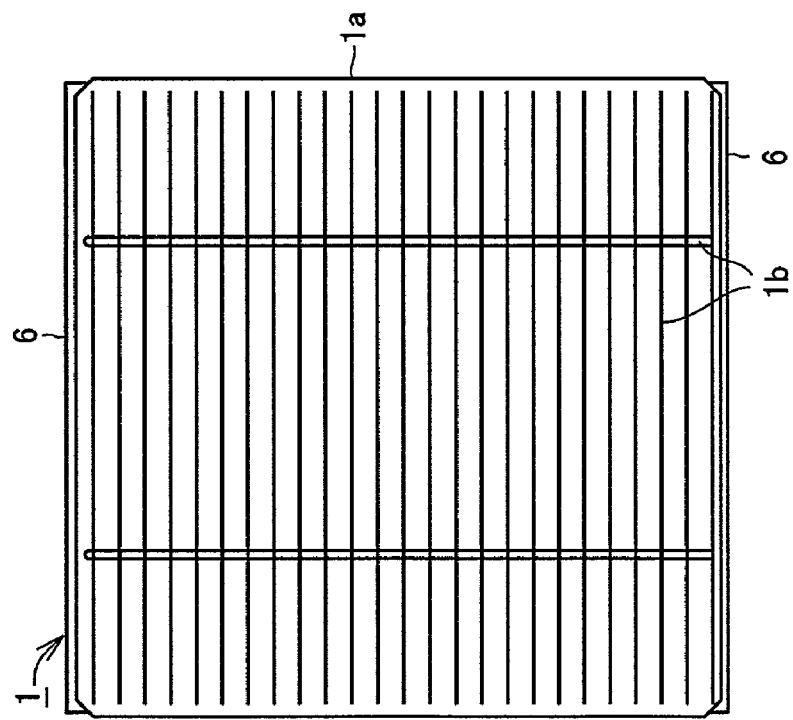

FIGS. 8A to 8C show a still further embodiment. FIG. 8A shows a front surface, FIG. 8B shows a side surface, and FIG. 8C shows a back surface, of a solar cell. In this embodiment, a solar cell 1 is reinforced by an aluminum plate, a ceramic plate or the like 6 joined with resin or the like 2d in vicinities of opposing two sides on the back surface of the cell. Such a reinforcing plate 6 may be joined slightly beyond the opposing two sides of solar cell 1. In this case, fracture of the cell can effectively be avoided by preventing the cell from directly abutting a jig during the production processes of the solar cell and the module.

In other words, in the embodiment shown in FIGS. 8A to 8C, an effect of reinforcing the solar cell can be enhanced by further reinforcement with aluminum plate, ceramic plate or the like 6 in addition to reinforcement with resin 2d. When an edge portion of reinforcing plate 6 extends slightly beyond and is joined to the opposing two sides of cell substrate 1a, the jig will directly abut not on cell substrate 1a but on reinforcing plate 6, for example in positioning cell 1 in the production process of the solar battery module. Thus, fracture of solar cell 1 can be reduced. Moreover, when conductive resin 2d and metal reinforcing plate 6 are used, an effect of lowering electrical resistance of the backside electrode of solar cell 1 can be obtained, and thus electrical output of the solar battery module can be improved.

Figures 9A, 9B:
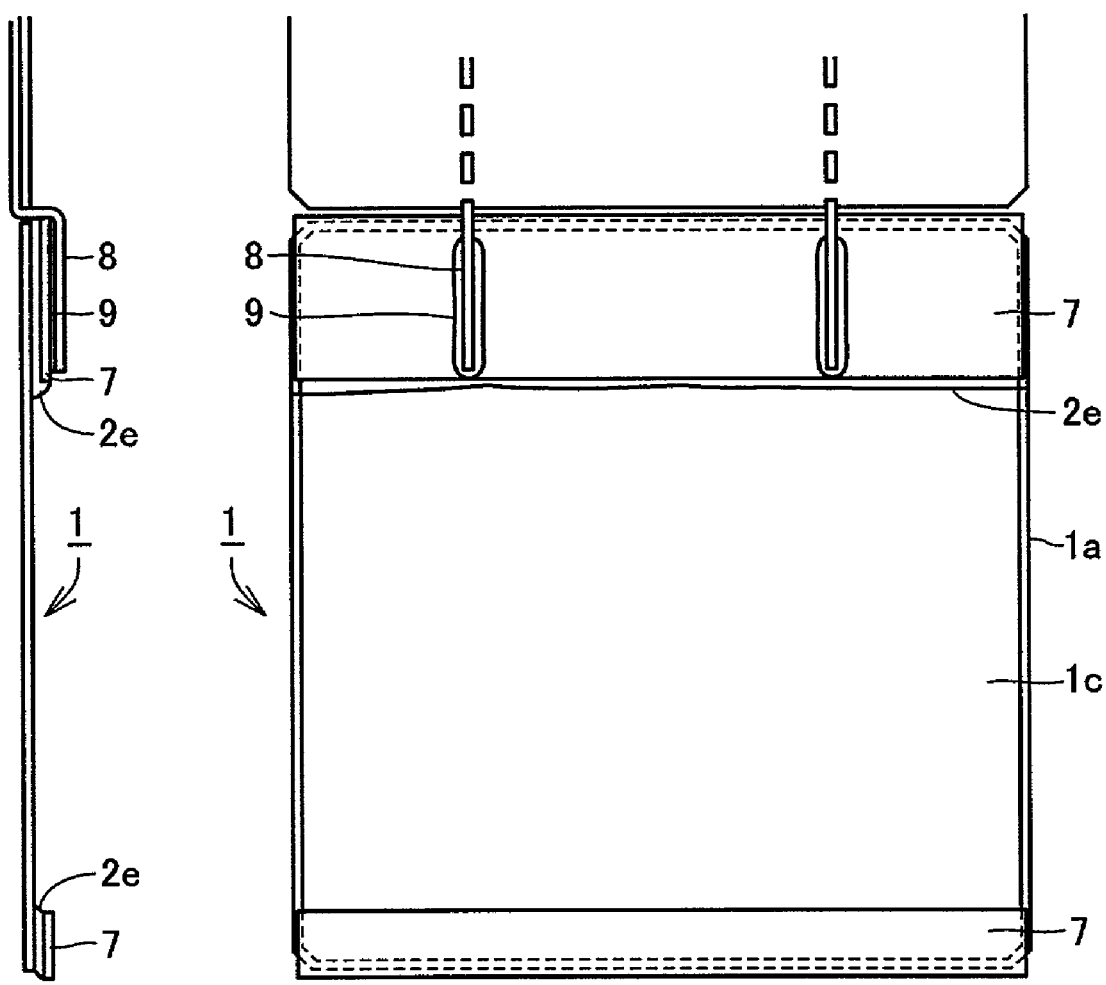

FIGS. 9A and 9B show a still further embodiment. FIG. 9A shows a side surface and FIG. 9B show a back surface of a solar cell. In this embodiment, a vicinity of each of opposing two sides on a back surface of a solar cell 1 is reinforced with a conductive resin 2e and a metal plate 7 joined thereto. Here, metal plate 7 is a solderable reinforcing plate. In the solar battery module including a plurality of solar cells 1 reinforced in such a manner, adjacent cells are electrically connected by interconnectors 8. That is, interconnector 8 soldered to metal reinforcing plate 7 of one solar cell 1 is connected to a comb-shaped electrode on the front side of adjacent solar cell 1.

Conventionally, at a connection portion of interconnector 8 made of copper band, thermal stress due to the difference of thermal expansion coefficients between the copper band 8, solder 9 and silicon substrate 1a as well as thermal stress imposed to the connection portion due to the difference of thermal expansion coefficients between a material composing the solar battery module and the solar cell has caused fracture in the solar cell in some cases. In the present embodiment, however, as conductive reinforcing materials 2e, 7 are used at the interconnector connection portion, such cell fracture can be prevented.

Figure 10:
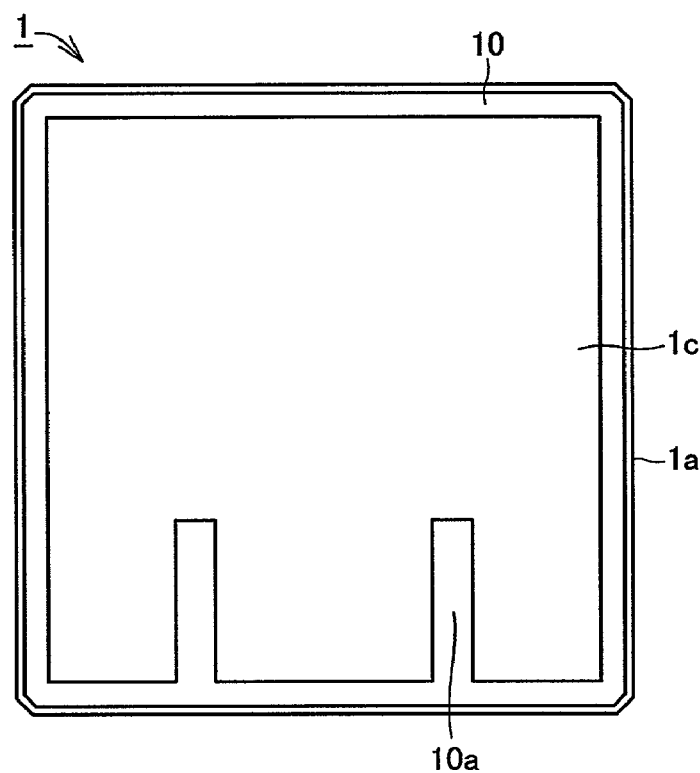

In an embodiment shown in FIG. 10, a vicinity of a peripheral edge on a back surface of a solar cell 1 is reinforced with a silver electrode 10. An interconnector is connected to a connection region 10a in the silver electrode region 10 by soldering. Since silver electrode region 10 has small electrical resistance and can have the surface solder-plated, it is expected that resistance of the backside electrode can be effectively lowered and electrical property of the solar battery module can be simultaneously improved.

Figure 11:
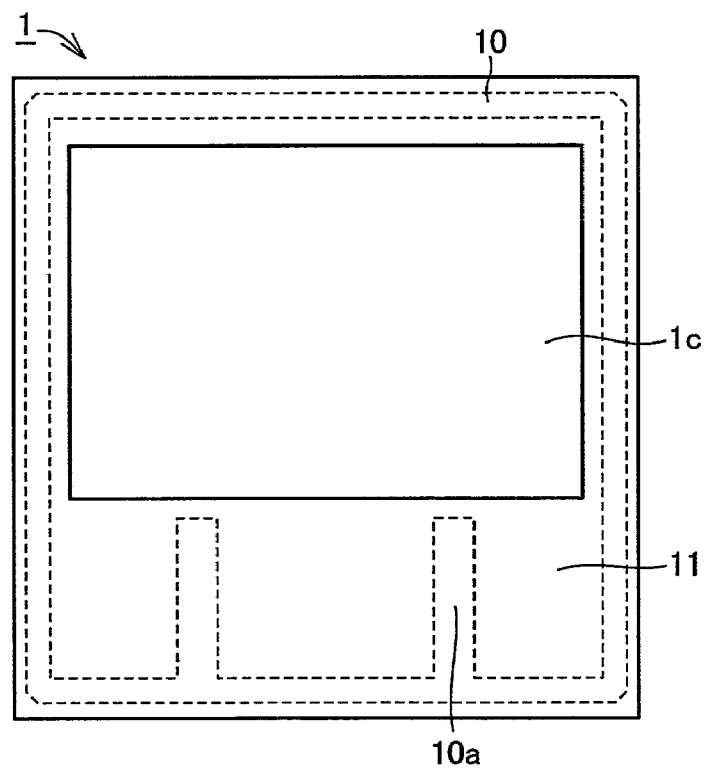

In an embodiment shown in FIG. 11, in addition to the embodiment in FIG. 10, the peripheral edge portion of a back surface of a solar cell is further reinforced by a metal reinforcing plate 11. That is, this metal reinforcing plate 11 is connected to silver electrode region 10 by soldering. It goes without saying that such a reinforcing plate may be provided to the entire back surface of solar cell 1. In the embodiment of FIG. 11, since the interconnector is soldered to metal reinforcing plate 11, the solar cell substrate will not be subject to thermal stress due to soldering or load via the interconnector from a module constituting portion. Thus, damage to the cell can be reduced, and reliability thereof can be improved.

In an embodiment shown in FIG. 12, a glass material is used for reinforcing material 2b in a similar case as in FIGS. 6A to 6C. In FIG. 12, an $n^+$ region in and a $p^+$ region 1p are formed on a p-type silicon substrate 1a, and then a baked aluminum backside electrode 1c is formed on $p^+$ region 1p. In other words, pn junction is easily isolated at the peripheral edge portion of the wafer by providing glass reinforcing material 2b in a step prior to forming the pn junction and backside electrode 1c on silicon substrate 1a, and improvement in electrical output of solar cell 1 can be achieved. In addition, by introducing such reinforcing material 2b in an earlier step of the production process of solar cell 1, cell fracture during the cell production process can be reduced.

By simultaneously carrying out heat treatment for baking backside electrode 1c and that for baking glass reinforcing material 2b on solar cell 1 in the same step, the effect of reinforcing the cell according to the present invention can be obtained without significantly increasing the steps in the cell production process. An example of powdered glass which can be used for a source material of baked glass reinforcing material 2b is GP-5210, GP-1410 or the like from Nippon Electric Glass Co., Ltd.

FIGS. 13A and 13B show a still further embodiment. FIG. 13A shows a side surface and FIG. 13B shows a back surface of a solar cell. In this embodiment, an aluminum plate 12 as a reinforcing plate is joined with a conductive adhesive 13 to the back surface side of the cell to cover almost entire area of baked aluminum electrode 1c. On aluminum reinforcing plate 12, silver electrode 10b is formed by printing and baking silver paste, and solder coating 9a is provided thereon. Current flowing in baked aluminum electrode 1c and aluminum reinforcing plate 12 can be collected to silver electrode portions 10b where the interconnectors are to be soldered.

FIGS. 14A and 14B show a still further embodiment. FIG. 14A shows a side surface and FIG. 14B shows a back surface of a solar cell. In this embodiment, a silver electrode 10 is formed by printing and baking silver paste on the peripheral portion of baked aluminum electrode 1c, and solder coating 9a is provided on silver electrode 10 by dipping. A steel plate is soldered to silver electrode 10 as a reinforcing plate 13, to which interconnectors 8 are connected with solder. In the present embodiment, the cell is reinforced not only with silver electrode 10 on the cell peripheral portion, but also with soldering reinforcing steel plate 13 to the cell by means of solder coating 9a on silver electrode 10. Since reinforcing steel plate 13 can serve also as an electrode, series resistance of the cell can be lowered and output thereof can be improved.

Figure 15A:
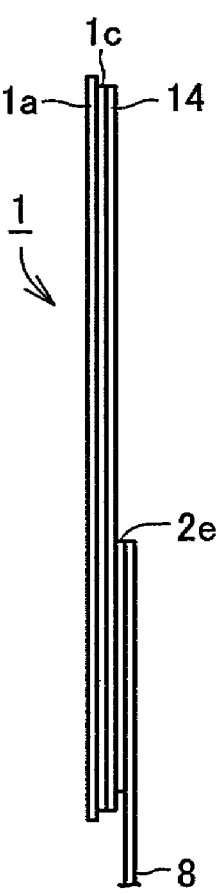
Figure 15B:
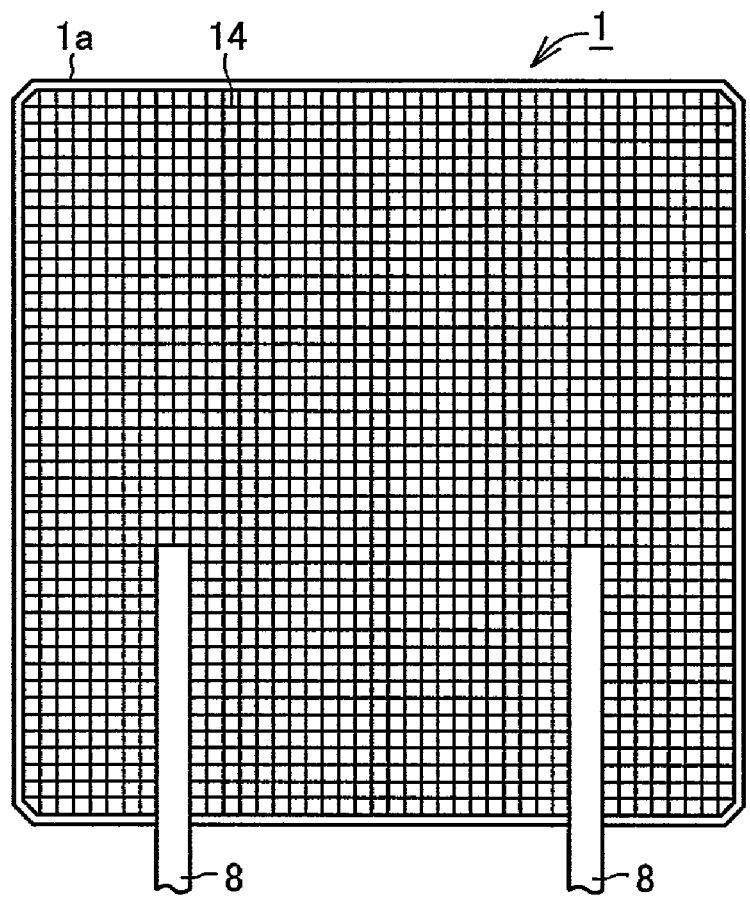

FIGS. 15A and 15B show a still further embodiment. FIG. 15A shows a side surface and FIG. 15B shows a back surface of a solar cell. In this embodiment, aluminum paste 1c is printed on the back surface of the solar cell substrate, and before it is dried, an aluminum reinforcing plate 14 is bonded to aluminum paste 1c. Thereafter, by drying and baking aluminum paste 1c, aluminum reinforcing plate 14 is joined to cell substrate 1a. Further, using conductive resin 2e, interconnectors 8 are attached to aluminum reinforcing plate 14. In FIGS. 15A and 15B, mesh aluminum plate 14 is used. In this case, by sufficiently evaporating solvent component and burning resin component in the paste when drying and baking aluminum paste 1c, joint property between cell substrate 1a and aluminum reinforcing plate 14 can be improved significantly.

Cell substrate 1a and reinforcing plate 14 may be welded together. In other words, instead of forming backside electrode 1c by printing and baking aluminum paste on the back surface of cell substrate 1a, thin aluminum plate 14 (as thick as about 200 μm) may be made in contact with a silicon surface on the back side of cell substrate 1a so as to directly join aluminum reinforcing plate 14 with the silicon surface by directing YAG (yttrium aluminum garnet) laser.

Solar cells of which reinforcing material is non-conductive are preferred in terms of avoiding electrical contact between adjacent solar cells in a solar battery module. More specifically, it is usually designed to provide a gap of about 0.5 to 2 mm between solar cells for preventing electrical contact between the cells. When it is difficult to precisely arrange solar cells in position, the cells can be arranged abutting each other, if a non-conductive reinforcing or buffering material is provided on the side surface of each solar cell. Then, it becomes easy to produce the solar battery module.

Figure 16A:
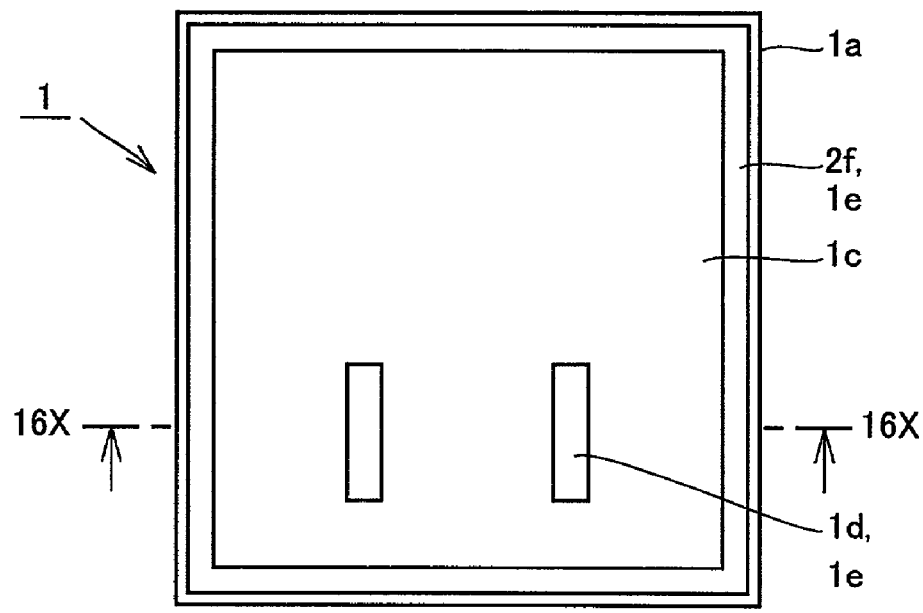
Figure 16B:
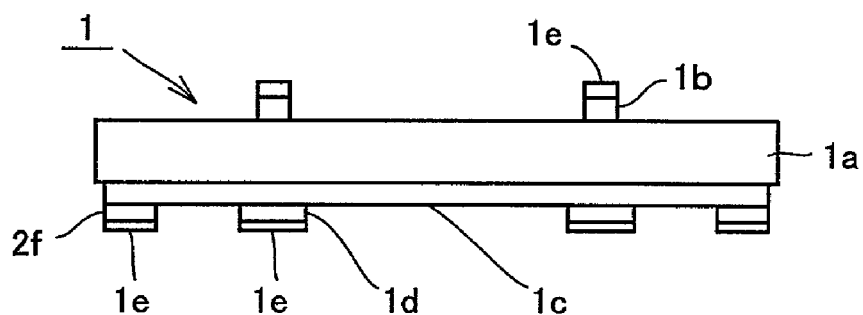

FIGS. 16A and 16B show a still further embodiment. FIG. 16A shows a back surface of a solar cell and FIG. 16B shows a cross-section taken along a line 16X-16X in FIG. 16A. In embodiments hereinafter, silicon wafers having an area of 125 mm square and a thickness of 300 μm are used for substrates. In the periphery of the back surface of solar cell 1 in FIGS. 16A and 16B, a pattern 2f of baked silver is formed, which serves as the reinforcing material. Since the surface of the reinforcing material 2f of baked silver is coated with a solder layer 2e by dip soldering, solder layer 1e further reinforces reinforcing material 2f.

Since reinforcing material 2f is formed with baked silver similarly as connection electrode 1d on the cell back surface, silver paste for them can simultaneously be printed and baked with screen process, and the effect of reinforcing the cell can be achieved without adding any process step. Specifically, reinforcing material pattern 2f and backside connection electrode 1d were printed to a thickness of about 30 μm using silver paste and a screen of SUS165 mesh. A pattern of baked silver was formed by baking silver paste print at about 600° C. after drying at about 150° C. Thereafter, the surface of baked silver was coated with solder layer by dip soldering.

As shown in FIG. 16B, reinforcing material pattern 2f was printed so as to overlay the peripheral edge portion of backside collector electrode 1c formed with baked aluminum. In this way, since reinforcing material pattern 2f is of baked silver, in addition to the effect of reinforcing, an effect of lowering electrical resistance in a direction parallel to the back surface of silicon substrate 1a is also achieved. Therefore, when a plurality of cells are connected in series, output property (particularly, FF: fill factor) of the cells can be improved, compared with a conventional example.

Figure 17:
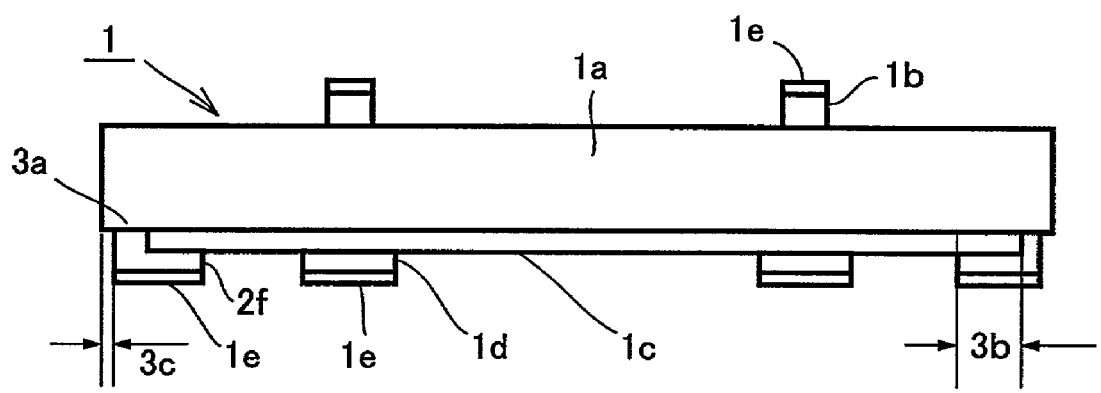

Although an embodiment shown in FIG. 17 is similar to that of FIGS. 16A and 16B, FIG. 17 is different in that reinforcing material pattern 2f is formed not only on the peripheral edge portion of backside collector electrode 1c but also overlaid on the peripheral edge portion of silicon substrate 1a. Since joint portion 3a between the baked silver reinforcing material pattern 2f and silicon wafer 1a has high joint strength, stronger reinforcement can be obtained effectively.

In FIG. 17, if an overlapping width 3b of reinforcing material pattern 2f and aluminum collector electrode 1c is too large, separation is likely at an interface between baked silver 2f and baked aluminum 1c after dip soldering. When width 3b was 8 mm, separation was observed in 7 solar cells out of 10 at the interface between baked silver and baked aluminum. When width 3b was 5 mm, separation was observed in 2 cells out of 10. When width 3b was 4 mm, separation was not observed in any cell. In other words, in order to obtain stable effect of reinforcing, width 3b is desirably 4 mm or smaller. In the present embodiment, the width was set to 1.5 mm. Here, separation was not observed in any out of 100 solar cells produced for trial.

In FIG. 17, if a distance 3c from the peripheral edge of silicon wafer 1a to that of reinforcing material pattern 2f is too small, leakage current is liable to increase in the peripheral edge portion of solar cell 1. Leakage current Id of a conventional solar cell was about 0.1A while Id was increased to about 0.3A when distance 3c was set to 0.2 mm. When distance 2c was set to 0.5 mm, Id was about 0.1A similarly as in a conventional example. That is, in order to obtain the effect of reinforcing the cell without lowering electric property of the cell, distance 3c is desirably 0.5 mm or larger. In the present embodiment, the distance was set to 1.0 mm.

Figure 18:
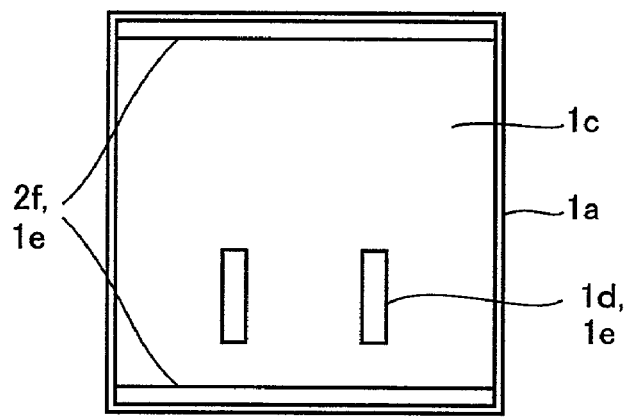

In FIG. 18, a back surface of a solar cell according to a still further embodiment is shown, in which baked silver reinforcement portion 2f is limited to vicinities of two sides opposing each other on the cell back surface. In the production process of the solar battery module, a cell edge portion is subject to large stress due to soldering of the interconnector made of metal having a thermal expansion coefficient considerably different from that of the solar cell. Therefore, cell fracture is liable to occur mainly along a direction of interconnector connection. Thus, as shown in FIG. 18, sufficient reinforcement effect can be obtained even if only two sides where cell fracture is liable to occur are provided with reinforcing material 2f. In such a case, usage of expensive silver paste can be reduced, and reinforcement can be obtained with low cost.

Figure 19A:
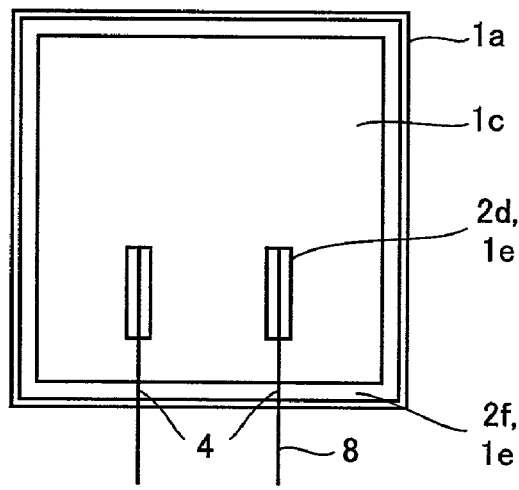

Although an embodiment shown in FIG. 19A is similar to that in FIG. 16A, an interconnector is provided to the solar cell in FIG. 19A. In this case, an interconnector 8 is not only connected to backside connection electrode 1d, but also electrically connected to connection portion 4 of reinforcing material pattern 2f. Since baked silver reinforcing material pattern 2f can serve also as a collector electrode, output property (FF) of the cell can be improved by connecting interconnector 8 also to baked silver pattern 2f.

In the present embodiment, a module was produced, in which reinforcing material pattern 2f and interconnector 8 are electrically connected by soldering, and 54 cells are serially connected. Table 1 below shows comparisons of cell fracture ratios as well as output properties between the module of the present embodiment and the module produced with conventional solar cells. In Table 1, Isc represents a short circuit current of the module, Voc represents an open-circuit voltage, and Pm represents a maximum output.

TABLE 1

|  | Isc [A] | Voc [V] | Pm [W] | FF | Ratio of Fracture |
| --- | --- | --- | --- | --- | --- |
| Conventional Module | 5.36 | 32.7 | 125.3 | 0.715 | 6.2% |
| Present Embodiment | 5.32 | 32.6 | 125.7 | 0.725 | 3.4% |

Figure 19B:
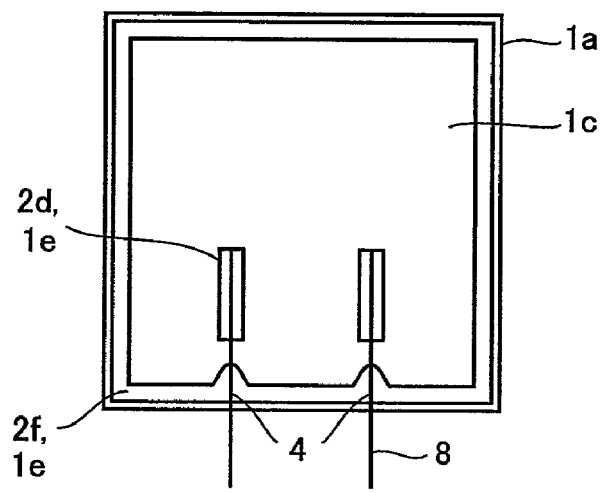

Although an embodiment shown in FIG. 19B is similar to that in FIG. 19A, width at portion 4 for connecting interconnector 8 to reinforcing material pattern 2f is made larger in FIG. 19B. When soldering interconnector 8 to reinforcing material pattern 2f, stress is concentrated at connection portion 4, and cell fracture is liable to originate therefrom. By distributing stress with connection portion 4 being widened as shown in FIG. 19B, therefore, output property (FF) in the module state can be improved with interconnector 8 being connected while preventing cell fracture.

Figure 20:
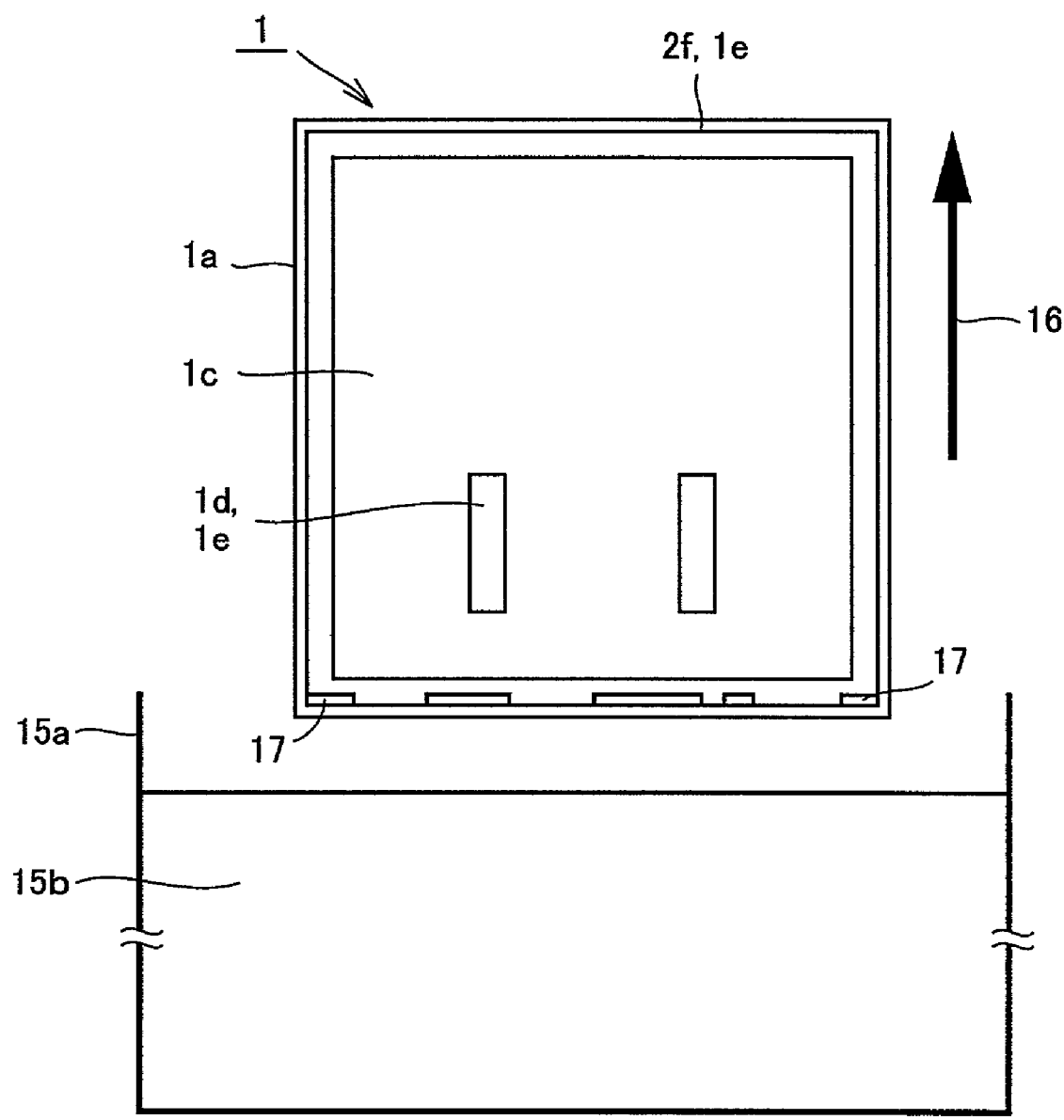
FIG. 20 illustrates an example of a step of dipping a solar cell into a solder bath.

FIG. 20 shows an example of dip soldering step for the solar cell of FIG. 16A. In the dip soldering step of this solar cell, cell 1 is once immersed in molten solder 15b in a solder bath 15a, and then pulled up vertically as shown with an arrow 16. In the dip soldering step, the cell provided with baked silver reinforcing material pattern 2f is liable to have solder accumulation 17 on reinforcing material 2 in a vicinity of the bottom side relative to the pull-up direction. If solder accumulation 17 is produced, cell fracture is more likely to occur originating therefrom. Solder accumulation 17 is produced because molten solder flows in large amount from the top to bottom along the pull-up direction.

Figure 21A:
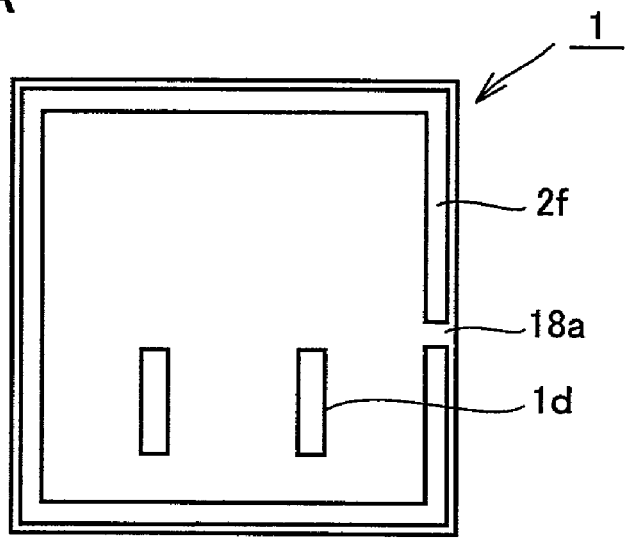
FIGS. 21A to 23 show solar cells according to yet other embodiments of the present invention.
Figure 21B:
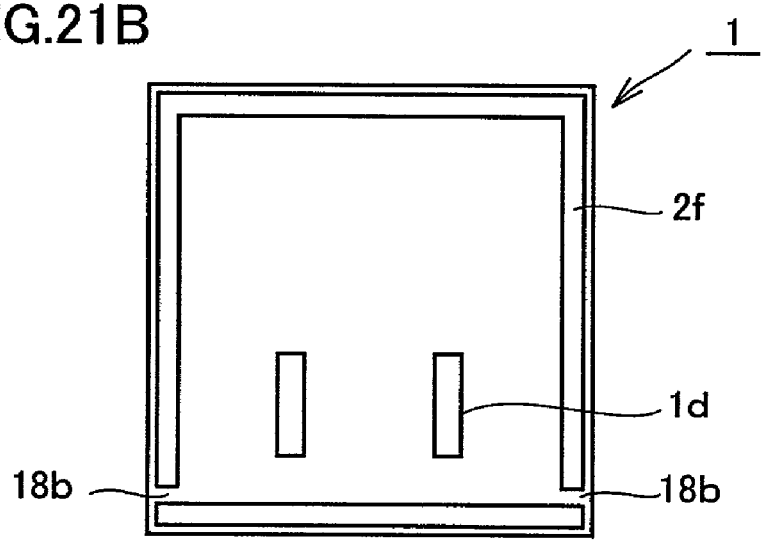
Figure 21C:
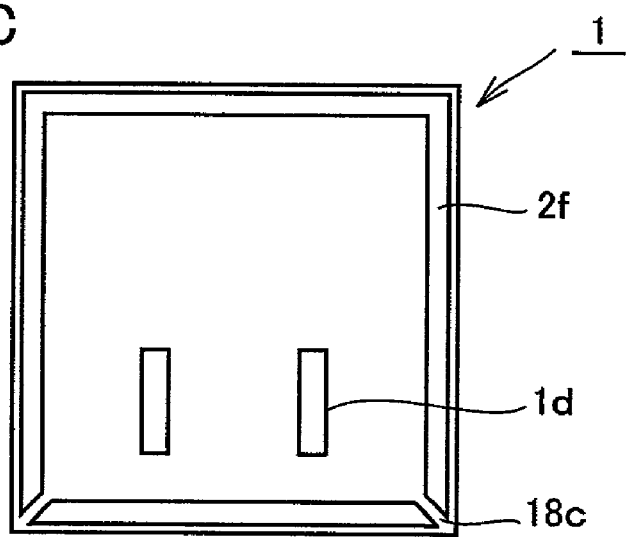

FIGS. 21A to 21C show back surfaces of solar cells according to still further embodiments. In FIG. 21A, one discontinuity 18a is provided in reinforcing material pattern 2f. Discontinuity 18a can retard solder flow into the bottom side of reinforcing material pattern 2f. Consequently, solder accumulation can be reduced.

In FIG. 21B, two discontinuities 18b are provided at both end portions of the bottom side of reinforcing material pattern 2f. Accordingly, solder flow to the bottom side of reinforcing material pattern 2f can be made smaller, and solder accumulation is less likely to occur.

Figure 22A:
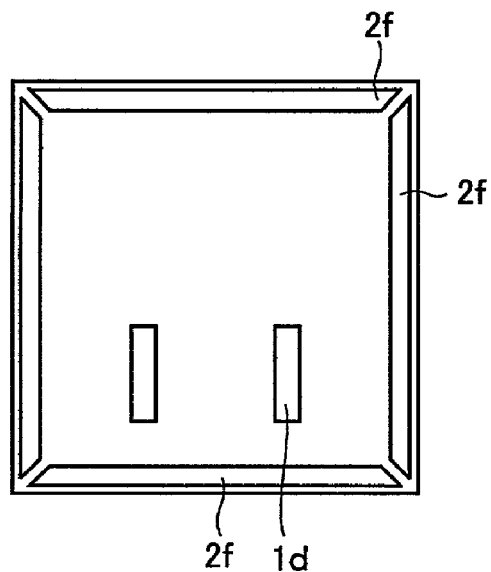
Figure 22B:
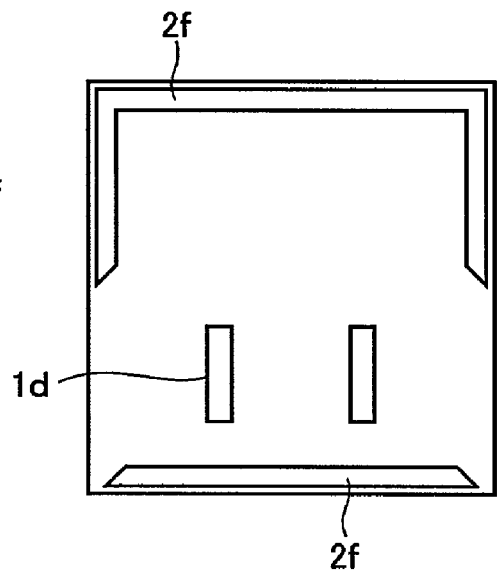
Figure 22C:
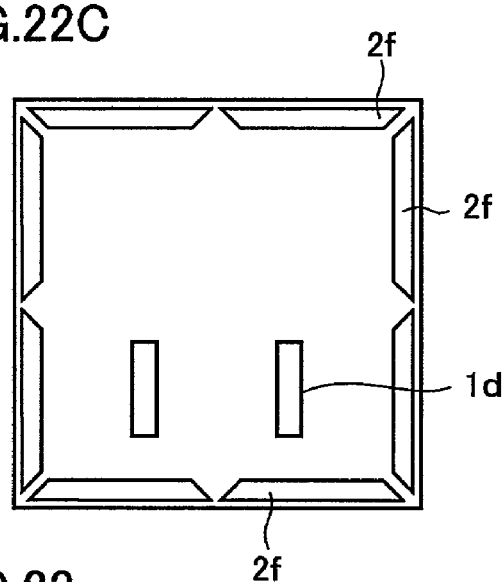

In FIG. 21C, two discontinuities 18c are provided along diagonals of rectangular cell 1 at both end portions of the bottom side of reinforcing material pattern 2f. Thus, solder accumulation can further be effectively suppressed. FIGS. 22A to 22C show other variations of discontinuities in reinforcing material pattern 2f.

Figure 23:
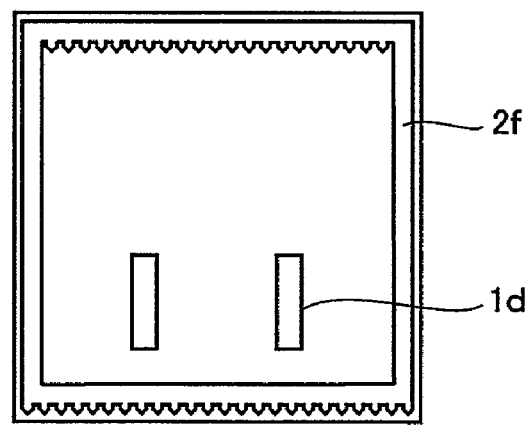

FIG. 23 show a back surface of a solar cell according to a still further embodiment. In FIG. 23, instead of providing a discontinuity in reinforcing material pattern 2f, a comb-teeth pattern is provided in an area where solder accumulation tends to occur, so as to prevent solder accumulation. In this case, since it is not necessary to form a discontinuity in baked silver reinforcing material pattern 2f, effect of lowering resistance as well as effect of reinforcing is not decreased.

Figure 24:
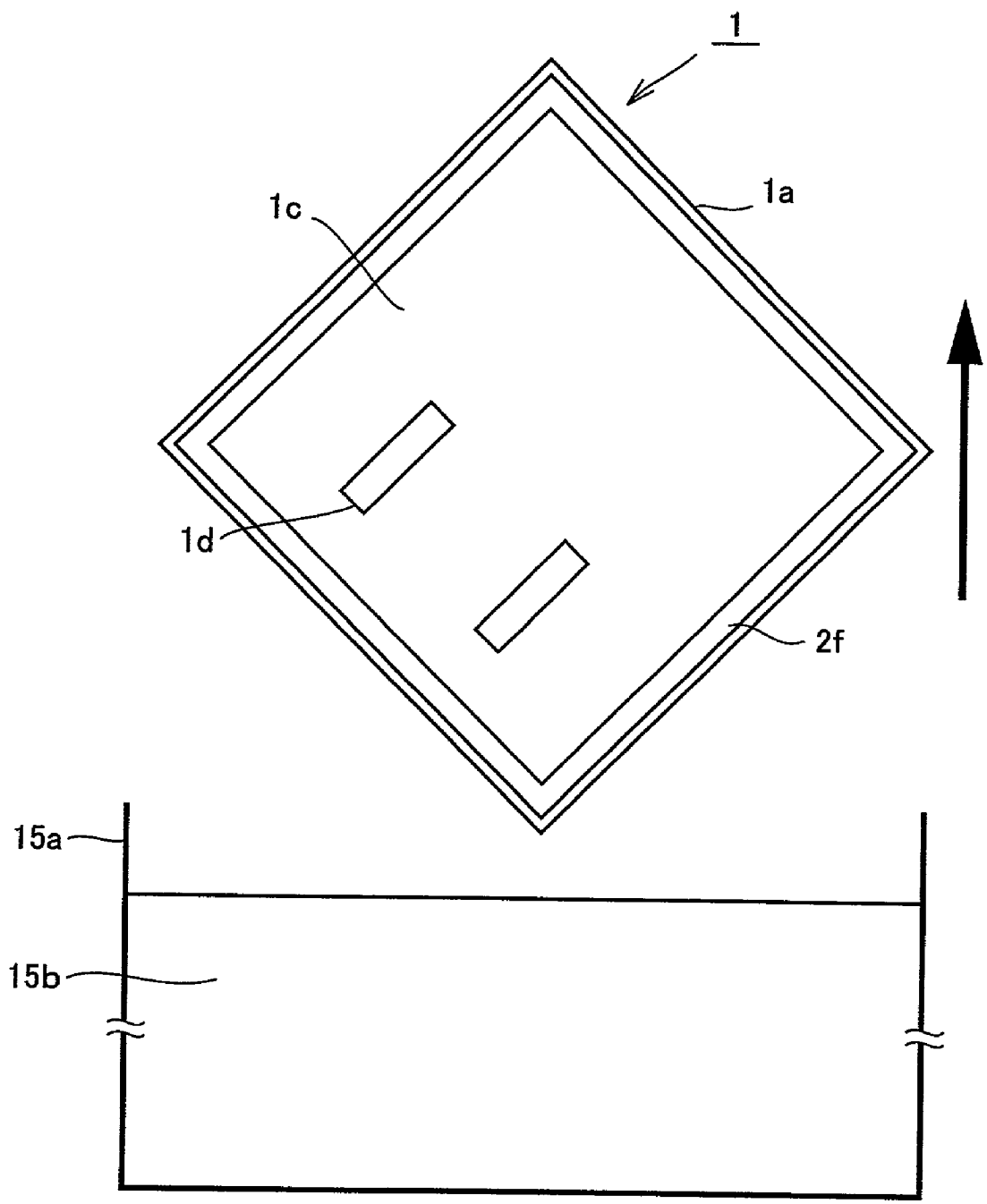
FIG. 24 illustrates another example of a step of dipping a solar cell into a solder bath.
Figure 25A:
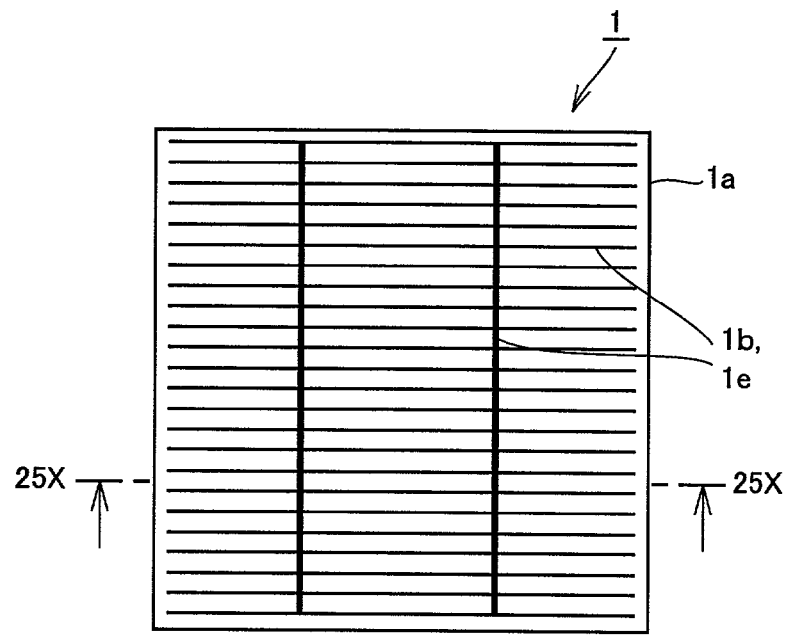
FIGS. 25A to 25C show a conventional solar cell.
Figure 25B:
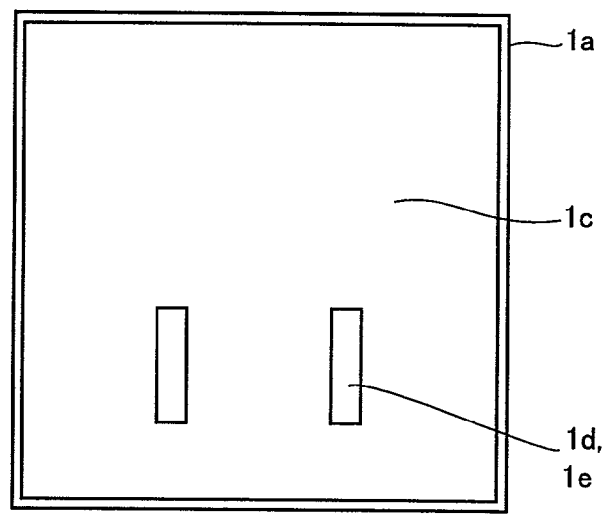
Figure 25C:
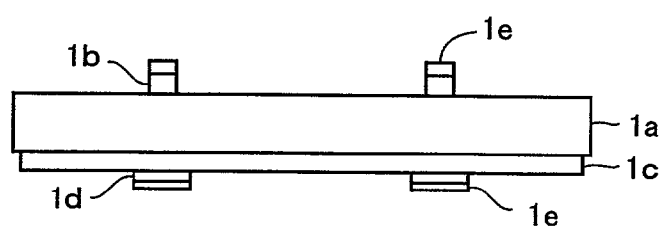

FIG. 24 shows another example of a dip soldering step for the solar cell of FIG. 16A. In FIG. 24, by pulling up rectangular cell 1 with the cell diagonally tilted, molten solder flow can be gathered at a corner thereof on any reinforcing material pattern. Since gathered solder is less likely to accumulate at the corner of the cell, solder accumulation on reinforcing material pattern 2f can be suppressed.

As described above, according to the present invention, occurrence of cell fracture due to external load can be decreased by reinforcing solar cell substrates. Thus, ratio of cell fracture in a production process of the solar cells can be lowered, and an availability factor of an apparatus for producing the cells can be improved. In addition, by suppressing cell fracture occurrence, it becomes possible to reduce work for cleaning the production apparatus as well as cost for the solar cells and modules improving use efficiency of material. Thus, performance and reliability of the completed solar battery modules can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising:
   a semiconductor substrate having a light incident front surface and a back surface;
   a backside collector electrode formed on the back surface of said substrate;
   a reinforcing material formed of a continuous, uninterrupted, complete loop of baked silver which extends on and along an entire periphery of a back surface of the backside collector electrode; and
   a connection electrode formed on the back surface of the backside collector electrode in an area of the backside collector electrode which is surrounded by the reinforcing material.

2. The solar cell according to claim 1, wherein the connection electrode is formed of baked silver.

3. The solar cell according to claim 1, wherein the backside collector electrode is formed of baked aluminum.

4. The solar cell according to claim 1, wherein the reinforcing material extends directly on and along the entire periphery of the back surface of the backside collector electrode, and the reinforcing material also extends directly on an entire peripheral edge portion of the back surface of the substrate.

5. The solar cell according to claim 4, wherein the loop of reinforcing material which extends directly on and along the entire periphery of the back surface of the backside collector electrode overlaps the entire periphery of the backside collector electrode with a width of at most 4 mm.

6. The solar cell according to claim 4, wherein said reinforcing material is formed at least 0.5 mm away from a peripheral edge of said substrate.

7. The solar cell according to claim 4, wherein the loop of reinforcing material extending directly on and along the entire periphery of the back surface of the backside collector electrode continuously extends to the entire peripheral edge portion of the back surface of said substrate.

8. The solar cell according to claim 1, wherein an interconnector is connected to both of the connection electrode and the reinforcing material.

9. The solar cell according to claim 8, wherein the loop of reinforcing material has a width extending along the back surface of the backside collector electrode which is larger in a region where said interconnector is connected.

10. The solar cell according to claim 1, wherein the loop is a square shaped loop.

* * * * *